(12) United States Patent
Hu et al.

(10) Patent No.: US 8,471,287 B2
(45) Date of Patent: Jun. 25, 2013

(54) LED PACKAGE AND METHOD FOR MAKING THE SAME

(75) Inventors: Pi-Chiang Hu, Hsinchu (TW); Shih-Yuan Hsu, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/370,317

(22) Filed: Feb. 10, 2012

(65) Prior Publication Data

US 2012/0326175 A1 Dec. 27, 2012

(30) Foreign Application Priority Data

Jun. 24, 2011 (CN) .......................... 2011 1 0173116

(51) Int. Cl.
*H01L 33/00* (2010.01)
(52) U.S. Cl.
USPC ............... 257/98; 257/99; 257/693; 257/730; 257/E33.058; 257/E33.072; 438/26; 438/27
(58) Field of Classification Search
None
See application file for complete search history.

(56) References Cited

U.S. PATENT DOCUMENTS

| | | | |
|---|---|---|---|
| 2008/0191227 A1* | 8/2008 | Kimura et al. | 257/98 |
| 2010/0025722 A1* | 2/2010 | Wada | 257/99 |
| 2010/0230700 A1* | 9/2010 | Kim | 257/98 |
| 2011/0024782 A1* | 2/2011 | Shum et al. | 257/98 |
| 2012/0056217 A1* | 3/2012 | Jung et al. | 257/89 |
| 2012/0061703 A1* | 3/2012 | Kobayashi | 257/98 |

* cited by examiner

*Primary Examiner* — Julio J Maldonado
*Assistant Examiner* — Molly Reida
(74) *Attorney, Agent, or Firm* — Altis Law Group, Inc.

(57) ABSTRACT

An LED package includes a substrate with two opposite lateral bulging portions, an LED die, an electrode structure, and a reflective layer. The substrate includes a first substrate and a second substrate stacked together; the first substrate and the second substrate are transparent; and the substrate includes an emitting surface for emitting light of the LED package. The electrode structure is sandwiched between the first substrate and the second substrate. The LED die is mounted in the substrate and electrically connected to the electrode structure. The reflective layer is formed on an outer surface of the substrate except the emitting surface and the bulging portions. The disclosure also provides a method for manufacturing such an LED package.

12 Claims, 8 Drawing Sheets

LED PACKAGE AND METHOD FOR MAKING THE SAME

BACKGROUND

1. Technical Field

The present disclosure generally relates to light emitting diode (LED) packages and method for making the same.

2. Description of Related Art

Generally, an LED package includes a substrate, electrodes formed on the substrate, and an LED die arranged on the substrate and electrically connected to the electrodes. A receiving cavity is usually defined by a cup on the substrate to receive the LED die therein. Generally, a reflective layer is formed on an inner surface of the cup defining the receiving cavity for reflecting out light of the LED die, thereby increasing the luminous efficiency of the LED package.

However, due to that the reflective layer being merely formed in the receiving cavity, the substrate does reflect light as a supplementary means for light reflection. Thus, the luminous efficiency of the LED package is still not satisfactorily high. Furthermore, the process of forming a reflective layer on the inner surface of the cup defining the receiving cavity is complex and difficult.

Therefore, it is necessary to provide an LED package which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED package, and method for making the LED package, in detail.

Figure 1:
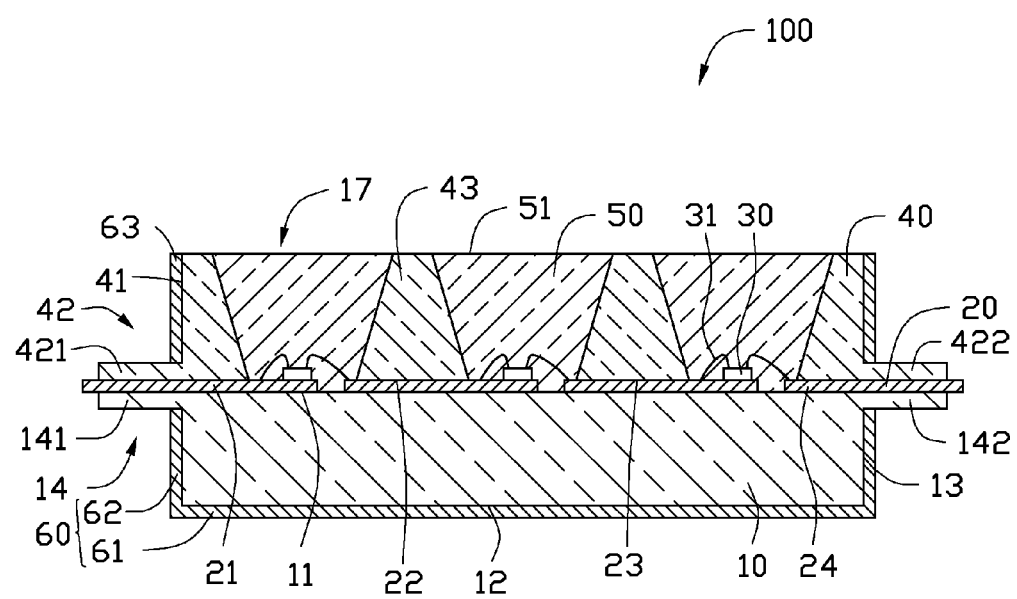
FIG. 1 is a schematic, cross-sectional view of an LED package in accordance with a first embodiment of the present disclosure.

Referring to FIG. 1, an LED package 100 of a first embodiment includes a first substrate 10, an electrode structure 20, three LED dies 30 fixed on the first substrate 10 and electrically connected to the electrode structure 20, a second substrate 40 attached on the first substrate 10, an encapsulation 50 received in the second substrate 40 and covering the LED dies 30, and a reflective layer 60. The second substrate 40 forms three cup-shaped structures each receiving a corresponding LED die 30 therein. It should be understood that the number of the LED dies 30 is not limited to be three. The first and second substrates 10, 40 are combined together as a substrate (not labeled) with the electrode structure 20 embedded within the substrate.

The first substrate 10 can be made of a transparent material, such as glass. In this embodiment, the first substrate 10 is rectangular and thin. The first substrate 10 includes a top surface 11, a bottom surface 12 opposite to the top surface 11 and a number of side surfaces 13 connecting the top surface 11 and the bottom surface 12. The top surface 11 and the bottom surface 12 are both flat. The top surface 11 carries the LED dies 30 thereon. A bulging portion 14 extends horizontally out from two opposite side surfaces 13 of the first substrate 10. The bulging portion 14 includes a first tab 141 and a second tab 142 respectively formed at the two opposite side surfaces 13. Top surfaces of the first tab 141 and the second tab 142 are coplanar with the top surface 11 of the first substrate 10.

Figure 2:
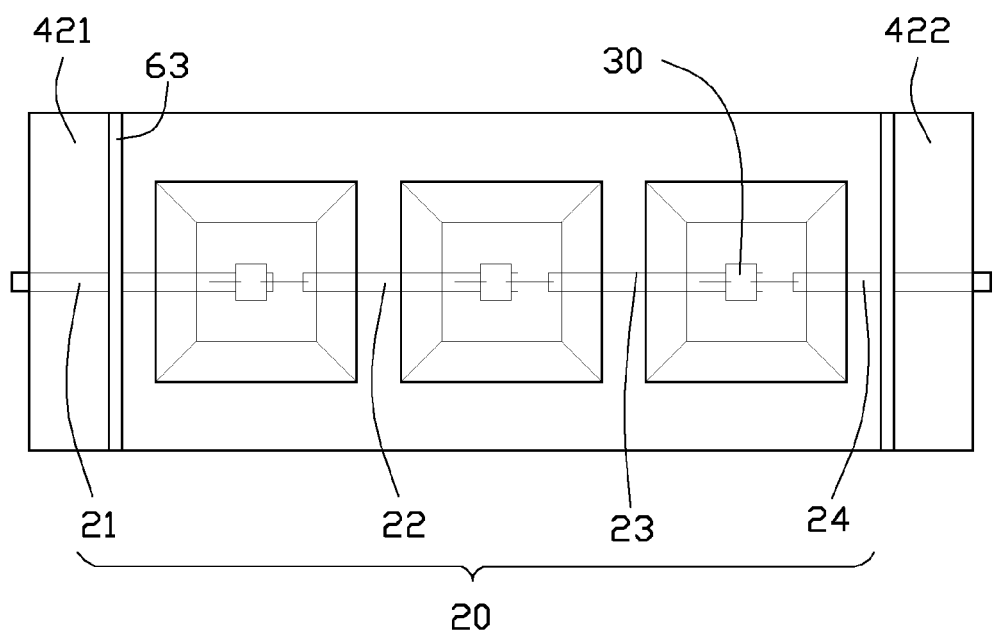
FIG. 2 is a schematic, top view of the LED package of FIG. 1.

Referring to FIG. 2 at the same time, in this embodiment, the electrode structure 20 is formed on the top surface 11 of the first substrate 10 and includes four electrodes, i.e., a first electrode 21, a second electrode 22, a third electrode 23, and a fourth electrode 24, spaced from each other and arranged in a line. One of the three LED dies 30 is electrically connected to the electrodes 21, 22; another of the three LED dies 30 is electrically connected to the electrodes 22, 23; and the other of the three LED dies 30 is electrically connected to the electrodes 23, 24. Accordingly, the three LED dies 30 are electrically connected together in series. It is to be understood the electrodes 21, 22, 23, 24 are formed corresponding to the LED dies 30, and the number of the electrodes should be changed according to the number of the LED dies 30. The electrode structure 20 is made of an opaque material, such as copper, gold. The width of the electrode structure 20 is smaller than that of the LED die 30, whereby part of the light radiated from the LED die 30 passes downwardly towards top surface 11 of the first substrate 10. The first electrode 21 and the fourth electrode 24 are located on the opposite outmost positions of the first substrate 10. The electrode structure 20 supplies power for the LED package 100 by connecting to an external circuit (not show). The electrode structure 20 can also be made of a transparent material, such as ITO (indium tin oxide).

The three LED dies 30 are arranged in a row on the first substrate 10. Each LED die 30 is electrically connected to a corresponding pair of electrodes with two metal wires 31. The three LED dies 30 are electrically connected together in series. The number of the LED die 30 depends on actual design requirement. The LED die 30 can radiate light from both top and bottom surfaces thereof.

The second substrate 40 is disposed on the top surface 11 of the first substrate 10. The material of the second substrate 40 is the same as the first substrate 10. Three through holes 17 are defined in the second substrate 40 to form three reflective cups 43 surrounding the three LED dies 30 respectively. In this embodiment, each through hole 17 is funnel-shaped and tapers along a direction towards the first substrate 10. The second substrate 40 includes a bottom surface attached to the top surface 11 of the first substrate 10, a top surface opposite to the bottom surface, and outer surfaces 41 connecting the bottom surface and top surface. An extending portion 42 extends outwardly from bottoms of the outer surfaces 41. The extending portion 42 includes a first extending part 421 and a second extending part 422. The first extending part 421 and the second extending part 422 are corresponding to the first tab 141 and the second tab 142 respectively. The first electrode 21 is sandwiched between the first tab 141 and the first extending part 421. The fourth electrode 24 is sandwiched between the second tab 142 and the second extending part 422. Outer ends of the first electrode 21 and the fourth electrode 24 are both exposed and located outside the bulging portion 14 and the extending portion 42.

The encapsulation 50 is filled in the through holes 17 to cover the LED dies 30 and the metal wires 31 in the second substrate 40. The top surface of the encapsulation 50 is coplanar with the top surface of the second substrate 40 to together constitute an emitting surface 51. Due to that the material of the second substrate 40 and the encapsulation 50 is transparent, the light radiated from each LED die 30 passes through the second substrate 40 and the encapsulation 50 and emits outwardly from the emitting surface 51.

The reflective layer 60 covers the outer surfaces 41 of the second substrate 40, the side surfaces 13 and bottom surface 12 of the first surface 10. The reflective layer 60 can be made of a material with excellent reflection efficiency, such as silver or mirror ink. The reflective layer 60 includes a flat portion 61 covering the bottom surface 12 of the first substrate 10, a first annular portion 62, and a second annular portion 63. The first annular portion 62 covers all of the side surfaces 13 of the first substrate 10, except the first tab 141 and the second tab 142. The second annular portion 63 covers all of the outer surfaces 41 of the second substrate 40, except the first extending portion 421 and the second extending portion 422. The first annular portion 62 and the second annular portion 63 are separated from each other by the bulging portion 14 and the extending portion 42. Thus, the outer ends of the first electrode 21 and the fourth electrode 24 which are located outside the outermost edges of the first substrate 10 are electrically insulated from each other. In alterable embodiment, the material of the reflective layer 60 can be electrically insulating, therefore the bulging portion 14 and the extending portion 42 can be omitted and the reflective layer 60 can be extended to connect with the electrodes 21, 24, without a worry that a short circuit between the electrodes 21, 24 of the electrode structure 20 may occur.

The reflective layer 60 covers all of the outer surfaces of the first substrate 10 and the second substrate 40, except for the emitting surface 51. One part of the light from the LED dies 30 emits upwardly via the emitting surface 51 directly. The other part of the light emits downwardly to the reflective layer 60, and then is reflected towards the emitting surface 51. In this embodiment, the light from the plurality of LED dies 30 are reflected by the reflective layer 60 which has a large area and travels to various directions to fully mix together; then the well mixed light emits from the emitting surface 51. Thus, the light from the LED package 100 has a uniform color. Furthermore, the light from the LED package 100 has an increased intensity.

The first substrate 10 or/and the second substrate 40 or/and the encapsulation 50 can be doped with phosphor particles to change the color of light from the LED dies 30, whereby light emitted from the LED package 100 can have a desired color. In addition or alternatively, there can also be a phosphor film on the emitting surface 51 to obtain the desired color of light from the LED package 100.

Figure 3:
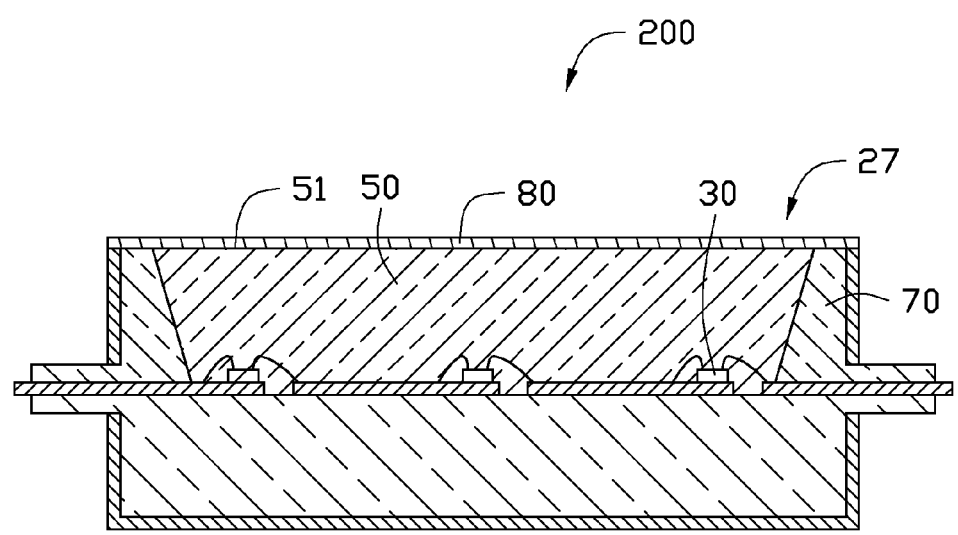
FIG. 3 is a schematic, cross-sectional view of an LED package in accordance with an alternative embodiment of the present disclosure.

Referring to FIG. 3, an LED package 200 of a second embodiment is shown, and the differences between this embodiment and the LED package 100 of the first embodiment are described below. In this embodiment, the LED package 200 includes a second substrate 70 defining a through hole 27 which receives all of the LED dies 30 therein. An encapsulation 50 is filled in the through hole 27 and covers all of the LED dies 30. The top surface of the encapsulation 50 is coplanar with the top surface of the second substrate 70, thereby forming an emitting surface 51 together with the second substrate 70. A phosphor film 80 is formed on the emitting surface 51.

Figure 4:
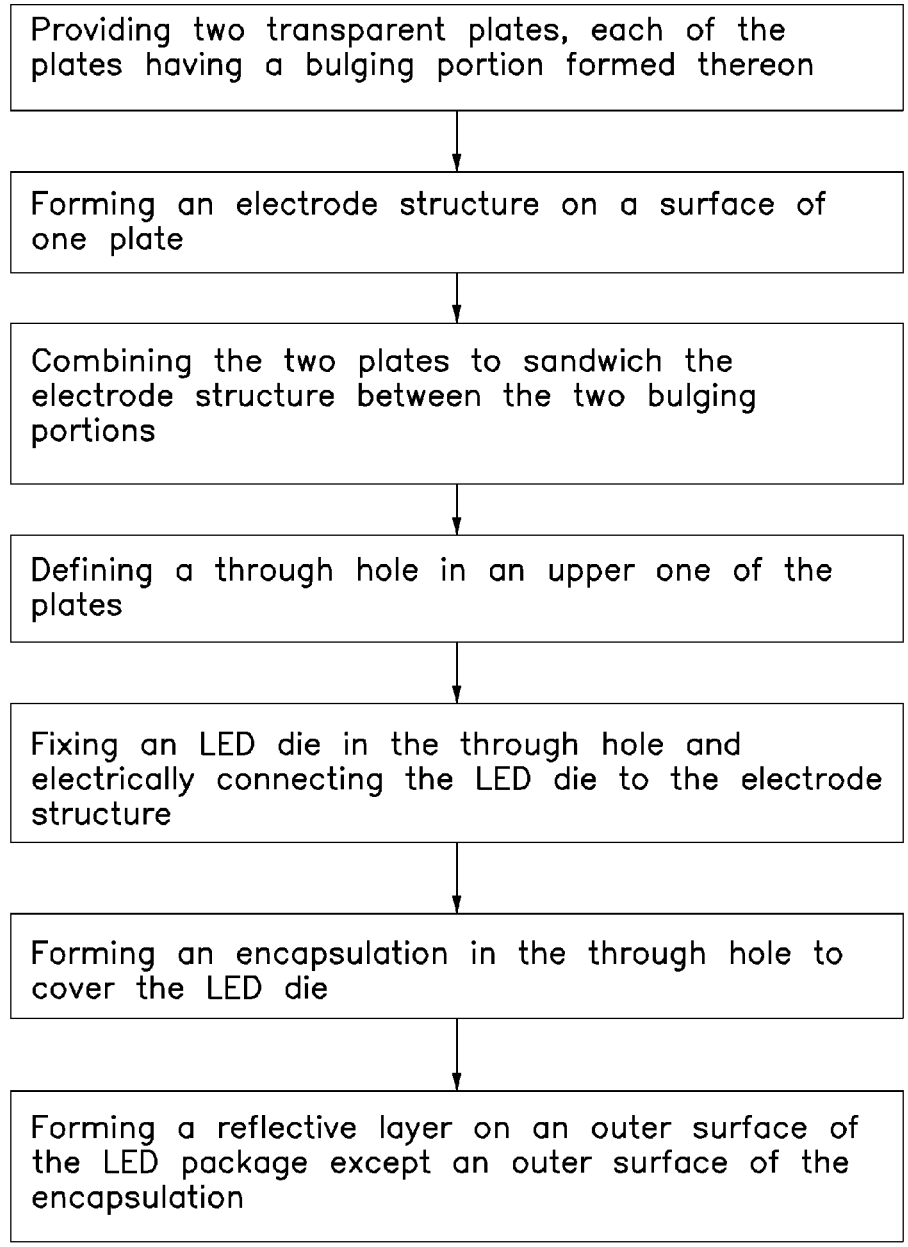
FIG. 4 is a flow chart of a method for forming an LED package in accordance with an embodiment of the present disclosure.

Referring to FIG. 4, the present disclosure further provides a method for making the LED package. The method includes following steps.

Figure 5:
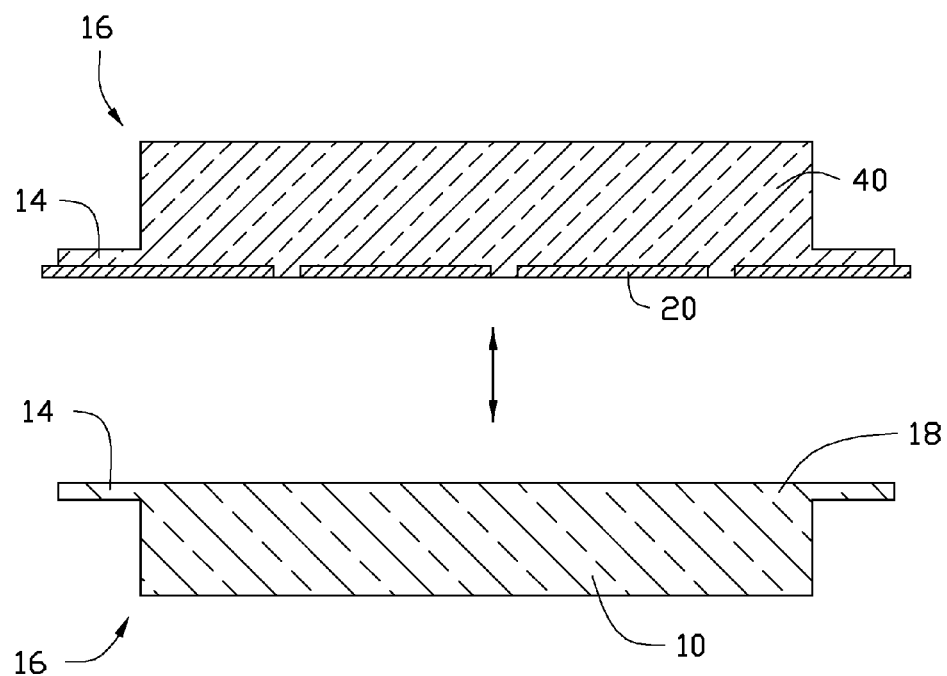
FIGS. 5-8 are schematic, cross-sectional views showing various steps of the method of FIG. 4.

Referring to FIG. 5, the first step of the method includes providing two transparent plates 16. Each plate 16 is cuboid. Two opposite edges of each plate 16 extend to form a bulging portion 14. The two plates 16 are of the same shape, so that they can be molded by the same mold.

The second step includes forming an electrode structure 20 on a surface of one plate 16. The electrode structure 20 includes a plurality of electrodes spaced from each other. The outer ends of the outmost electrode extend out of the bulging portion 14. In this embodiment, four electrodes are shown, and it should be understand that the number of the electrodes is not limited to be four.

Figure 6:
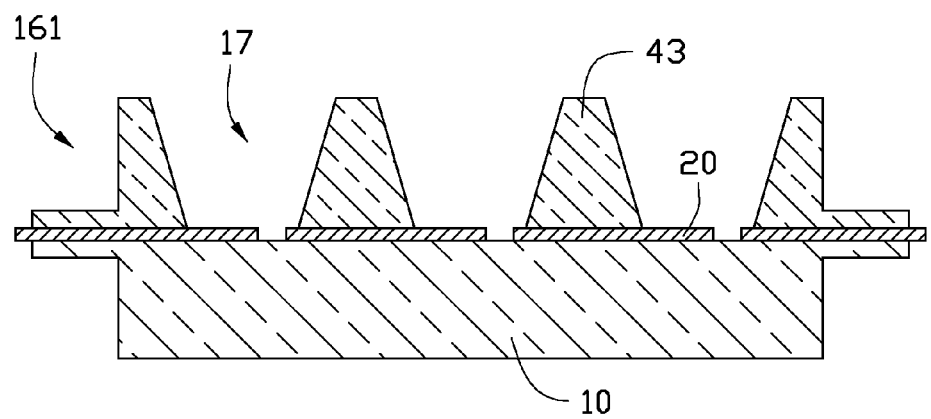

Referring to FIG. 6, the third step includes combining the two plates 16 together to sandwich the electrode structure 20 between the two bulging portions 14. One plate 16 above the other is used as the second substrate 40, and the other plate 16 is used as the first substrate 10 of the LED package 100 of FIG. 1. The two plates 16 are combined together by heating or gluing.

The fourth step includes defining a plurality of through holes 17 in the second substrate 40. The through holes 17 are used as reflective cups 43. Each through hole 17 receives two electrodes. The through holes 17 can be made by machining operation, such as cutting, or grinding. In this embodiment, there are three through holes 17. In an alternative embodiment, there can be only one through hole 17, as viewed from FIG. 3.

Figure 7:
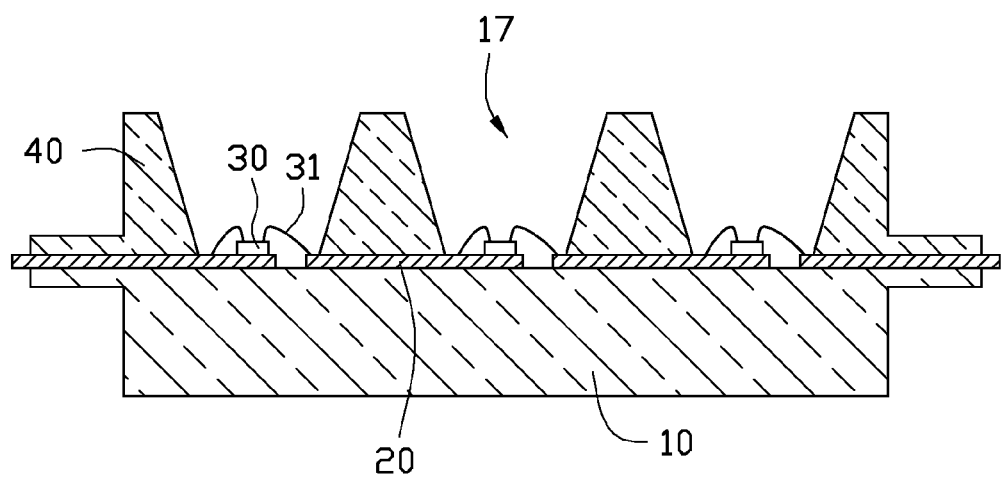
Figure 8:
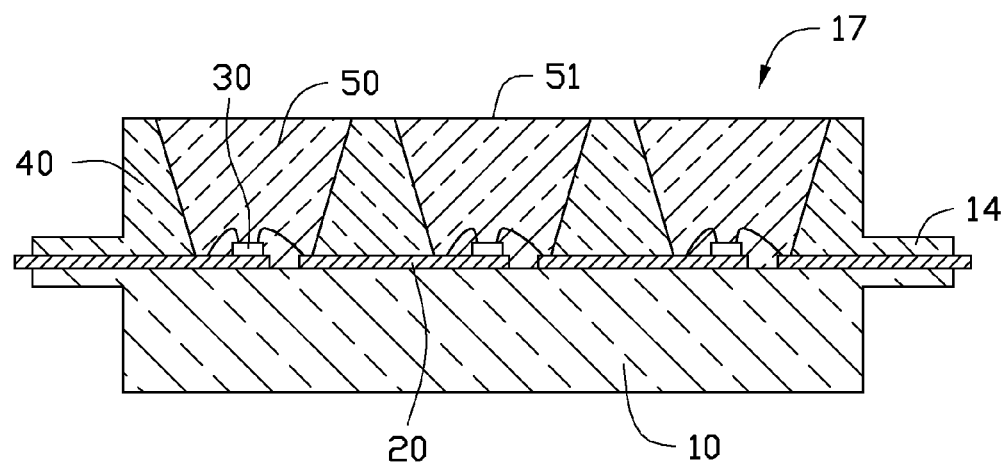

Referring to FIG. 7, the fifth step includes fixing the LED dies 30 in the through holes and electrically connecting the LED dies 30 to the electrode structure 20. Each LED die 30 is electrically connected to the electrodes with two metal wires 31 by die attaching and wire bonding. In an alternative embodiment, the LED dies 30 can be electrically connected to the electrodes by flip chip bonding.

The sixth step includes filling a transparent encapsulation 50 in the through holes 17 of the reflective cups 43 of the second substrate 40. The encapsulation 50 covers the LED dies 30 and the metal wires 131. The top surface of the encapsulation 50 is coplanar with the top surface of the second substrate 40, forming an emitting surface 51 together with the second substrate 40.

The last step includes forming a reflective layer 60 on the outer surface of the LED package 100, except for the emitting surface 51 and the bulging portion 14. The reflective layer 60 can be made by spraying of a material with excellent reflective property.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED package comprising:
   a substrate comprising a first substrate and a second substrate stacked together, the first substrate and the second substrate being transparent, the substrate comprising an emitting surface for emitting light of the LED package;
   an electrode structure sandwiched between the first substrate and the second substrate;
   at least one LED die mounted in the substrate and electrically connected to the electrode structure; and
   a reflective layer being formed on an outer surface of the substrate except the emitting surface;

wherein the electrode structure includes a plurality of electrodes spaced from each other, and outer ends of outmost electrodes extend outside opposite sides of the substrate; and wherein a bulging portion extends outwardly from the first substrate close to the second substrate, an extending portion extends outwardly from the second substrate close to the first substrate, the bulging portion and the extending portion are face to face with the outmost electrodes sandwiched therebetween, and the outer ends of the outmost electrodes extend out of the bulging portion and the extending portion, and wherein the reflective layer is made of electrically conductive material and formed on the outer surface of the substrate except the emitting surface and the bulging portion and the extending portion.

2. The LED package of claim 1, wherein a plurality of through holes are defined in the second substrate, the at least one LED die includes a plurality of LED dies, and each through hole receives one LED die therein and is filled with an encapsulation covering said one LED die.

3. The LED package of claim 1, wherein a through hole is defined in the second substrate, the at least one LED die includes a plurality of LED dies, and the through hole receives the plurality of LED dies therein and is filled with an encapsulation covering the plurality of LED dies.

4. The LED package of claim 3, wherein a phosphor film is formed on an outer surface of the encapsulation.

5. The LED package of claim 1, wherein the electrode structure is made of an opaque material, and a width of the electrode structure is smaller than that of the at least one LED die.

6. An LED package comprising:
a substrate comprising two flat surfaces and a plurality of side surfaces between the two flat surfaces, the substrate being transparent, one of the two flat surfaces being an emitting surface of the LED package;
an electrode structure embedded within the substrate and extending through the side surfaces of the substrate;
at least one LED die mounted in the substrate and electrically connected to the electrode structure; and
a reflective layer being formed on the other one of the two flat surface and the side surfaces for reflecting light emitted from the at least one LED die and incident on the other one of the two flat surface and the side surfaces towards the emitting surface;

wherein a bulging portion and an extending portion extend outwardly from the substrate, the electrode structure is sandwiched between the bulging portion and the extending portion, and outer ends of electrode structure extend out of the bulging portion and the extending portion, and wherein the reflective layer is made of metallic material and is formed on the other one of the two flat surface and the side surfaces except the bulging portion and the extending portion.

7. The LED package of claim 6, wherein the electrode structure includes a first electrode and a second electrode spaced from each other, and outer ends of the first electrode and the second electrode extend outside opposite sides of the substrate.

8. A method for making an LED package, comprising:
providing two transparent plates, each of the plates having a bulging portion formed thereon;
forming an electrode structure on a surface of one plate;
combining the two plates to sandwich the electrode structure between the two bulging portions;
defining a through hole in an upper one of the two transparent plates;
fixing at least an LED die in the through hole and electrically connecting the at least an LED die to the electrode structure;
forming an encapsulation in the through hole to cover the at least an LED die; and
forming a reflective layer on an outer surface of each of the two plates except the two bulging portions and a top face of the upper one of the two transparent plates, the reflective layer being made of electrically conductive material.

9. The method of claim 8, wherein outer ends of the electrode structure extend out of the bulging portions.

10. The method of claim 8, wherein the two plates are combined together by one of heating and gluing.

11. The method of claim 8, wherein the encapsulation is formed by injection molding or transfer molding.

12. The method of claim 8, wherein the encapsulation is doped with phosphor particles therein.

\* \* \* \* \*